United States Patent
Yang

(10) Patent No.: US 7,385,249 B2
(45) Date of Patent: Jun. 10, 2008

(54) TRANSISTOR STRUCTURE AND INTEGRATED CIRCUIT

(75) Inventor: Shih-I Yang, Sanchung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 215 days.

(21) Appl. No.: 10/952,010

(22) Filed: Sep. 28, 2004

(65) Prior Publication Data

US 2005/0095766 A1    May 5, 2005

Related U.S. Application Data

(63) Continuation of application No. 10/371,516, filed on Feb. 20, 2003, now Pat. No. 6,864,161.

(51) Int. Cl.
| | |
|---|---|
| H01L 29/745 | (2006.01) |
| H01L 29/744 | (2006.01) |
| H01L 27/105 | (2006.01) |
| H01L 29/762 | (2006.01) |
| H01L 29/94 | (2006.01) |
| H01L 29/78 | (2006.01) |

(52) U.S. Cl. ............... 257/331; 257/138; 257/151; 257/153; 257/202; 257/250; 257/270; 257/285; 257/300; 257/365; 257/366; 257/412

(58) Field of Classification Search ............... 257/64, 257/67
See application file for complete search history.

(56) References Cited

U.S. PATENT DOCUMENTS 4,740,481 A * 4/1988 Wilson et al. ............... 438/659

(Continued)

FOREIGN PATENT DOCUMENTS

JP    56029349    * 3/1981

OTHER PUBLICATIONS

John L. Vossen, Thin Film Processes II, Academic Press, 1991, pp. 762-768.

(Continued)

*Primary Examiner*—Carl Whitehead, Jr.
*Assistant Examiner*—Ex. Mitchell

(57) ABSTRACT

A process for forming a conductive gate structure for a sub-0.25 MOSFET technology, has been developed. The process features a conductive gate structure defined from a composite polysilicon or amorphous layer, which in turn is obtained via a dual deposition procedure. The first, or underlying silicon layer of the composite silicon layer, is deposited using a first silane flow rate which results in a silicon layer offering good performance characteristics but comprised with large silicon bumps. The second or overlying silicon layer of the composite silicon layer, is next deposited using a second silane flow rate, with the second silane flow greater than the silane flow used for the underlying silicon layer. The second silicon layer is formed with silicon bumps smaller in size than the silicon bumps of the first silicon layer. The narrow width, conductive gate structure, defined from the composite silicon layer via an anisotropic RIE procedure, provides performance characteristics greater than the performance characteristics of counterpart gate structures defined from silicon layers deposited using only the high, second silane flow rate. In addition the narrow width, conductive gate structure provides a reduced silicon bump size and thus improved yield, when compared to counterpart gate structures defined from silicon layers deposited using only the low, or first silane flow rate.

20 Claims, 2 Drawing Sheets

U.S. PATENT DOCUMENTS

| | | | | |
|---|---|---|---|---|
| 4,892,835 | A * | 1/1990 | Rabinzohn et al. | 438/184 |
| 5,276,347 | A * | 1/1994 | Wei et al. | 257/388 |
| 5,498,555 | A | 3/1996 | Lin | |
| 5,554,566 | A * | 9/1996 | Lur et al. | 438/655 |
| 5,753,559 | A * | 5/1998 | Yew et al. | 438/398 |
| 5,888,853 | A | 3/1999 | Gardner et al. | |
| 5,912,490 | A * | 6/1999 | Hebert et al. | 257/340 |
| 5,981,383 | A * | 11/1999 | Lur et al. | 438/655 |
| 6,107,156 | A * | 8/2000 | Shimizu et al. | 438/398 |
| 6,159,820 | A | 12/2000 | Park | |
| 6,187,675 | B1 * | 2/2001 | Buynoski | 438/655 |
| 6,214,705 | B1 | 4/2001 | Ting | |
| 6,339,010 | B2 | 1/2002 | Sameshima | |
| 6,492,688 | B1 * | 12/2002 | Ilg | 257/369 |
| 6,559,039 | B2 | 5/2003 | Wang et al. | |
| 6,559,052 | B2 | 5/2003 | Li et al. | |
| 6,562,730 | B2 | 5/2003 | Jeng | |
| 6,617,639 | B1 | 9/2003 | Wang et al. | |
| 6,620,671 | B1 | 9/2003 | Wang et al. | |
| 6,709,912 | B1 * | 3/2004 | Ang et al. | 438/199 |
| 6,992,388 | B2 * | 1/2006 | Li | 257/739 |
| 2002/0006706 | A1 * | 1/2002 | Nishida et al. | 438/299 |
| 2002/0066935 | A1 * | 6/2002 | Shimizu et al. | 257/412 |
| 2002/0070452 | A1 * | 6/2002 | Li | 257/739 |
| 2002/0175371 | A1 * | 11/2002 | Hause et al. | 257/344 |
| 2002/0192932 | A1 * | 12/2002 | Tsai et al. | 438/592 |
| 2003/0100173 | A1 * | 5/2003 | Shirahata et al. | 438/595 |
| 2004/0026734 | A1 * | 2/2004 | Clevenger et al. | 257/318 |
| 2006/0154423 | A1 * | 7/2006 | Fried et al. | 438/283 |

OTHER PUBLICATIONS

John L. Vossen, Thin Film Processes, Academic Press, 1978, pp. 259, 271, 273.

* cited by examiner

TRANSISTOR STRUCTURE AND INTEGRATED CIRCUIT

This application is a continuation of U.S. patent application Ser. No. 10/371,516 to Shih-I Yang, entitled "Method of Forming a Gate Structure Using a Dual Step Polysilicon Deposition Procedure", filed Feb. 20, 2003, now U.S. Pat. No. 6,864,161.

BACKGROUND OF THE INVENTION

(1) Field of the Invention

The present invention relates to methods used to fabricate semiconductor devices, and more specifically to a method used to form a gate structure for a metal oxide semiconductor field effect transistor (MOSFET), device.

(2) Description of Prior Art

To continue to increase MOSFET device performance channel lengths have to be reduced to sub-0.25 micrometers (um) dimensions. Advances in specific semiconductor disciplines such as photolithography and dry etching have allowed sub-0.25 um MOSFET devices to be obtained. However, to maintain high device yield as well as high device performance, specific characteristics of MOSFET elements have to be optimized. For example, gate structures with widths of 0.25 um, or less, are routinely defined from polysilicon layers. The deposition conditions used for polysilicon in regards to silane or disilane flow, influence grain size as well as the density of bumps or imperfections of the polysilicon layer. Polysilicon layers deposited using low silane flow rates when used for gate structures, offer higher performance than counterpart gate structures defined from polysilicon layers deposited using higher silane flows. This is due to a greater number of polysilicon bumps when compared to counterpart polysilicon layers featuring less bumps formed using higher silane flows. Polysilicon gate structures defined from low silane flow polysilicon layers offer a greater number of polysilicon bumps when compared to counterpart polysilicon layers featuring less bumps formed using higher silane flows. Polysilicon gate structures defined from low silane flow polysilicon layers offer a great level of integrity at polysilicon gate-gate insulator interface, in addition to more uniform doping, when compared to polysilicon gate structures defined from high silane flow polysilicon layers, thus resulting in the desired enhanced device performance. However, the number of bumps, or defect density of the polysilicon layer obtained via low silane flows, is higher than the level of bumps or defect density of counterpart polysilicon layers obtained via deposition using higher silane flows, therefore resulting in difficulties when attempting to define narrow width polysilicon gate structures from bumpy polysilicon layers. Therefore, when defining shrinking gate widths, sub-0.25 um, or gate widths of 0.22 um, the dimension and density of polysilicon bumps for the low flow vintage adversely influence the use of polysilicon layers deposited entirely using low silane flows, as a gate material.

This invention will describe a dual polysilicon deposition procedure allowing polysilicon gate structures for sub-0.25 um, (or 0.22 um), MOSFET devices to be formed offering higher performance then polysilicon gate structures defined from polysilicon layers deposited using only a high flow silane flow. In addition the dual polysilicon deposition procedure described in this invention will provide a gate structure with a bump density lower than counterpart polysilicon gate structures formed from polysilicon layers deposited entirely using a low silane flow. Prior art such as Gardner et al, in U.S. Pat. No. 5,888,853, Park, in U.S. Pat. No. 6,159,820, and Samashima, in U.S. Pat. No. 6,339,010, describe methods of depositing polysilicon layers. However none of these prior art describe the novel dual polysilicon deposition process described in this present invention, in which sub-layers of polysilicon are deposited at specific silane flows, to optimize polysilicon gate performance as well as to reduce polysilicon bump, or defect density.

SUMMARY OF THE INVENTION

It is an object of this invention to define a polysilicon gate structure from a polysilicon layer deposited using multiple silane flow rate cycles to optimize the performance of, and to reduce the number of bumps or defects of; the polysilicon layer.

It is another object of this invention to deposit an underlying portion of the polysilicon layer, to be used for a narrow polysilicon gate structure, using a first silane flow adjusted to optimize gate structure performance.

It is still another object of this invention to deposit an overlying portion of the polysilicon layer to be used for a narrow gate width polysilicon gate structure, using a second silane flow, with the second silane flow higher than the first silane flow, used to reduce the number and size of polysilicon bumps, when compared to the size and density of polysilicon bumps of polysilicon layers deposited using only a lower silane flow.

In accordance with the present invention a method of forming a polysilicon layer using multiple deposition cycles, each performed using a specific silane flow designed to optimize the performance of, and to decrease the number of bumps of, a subsequently defined polysilicon gate structure, is described. After formation of a gate insulator layer on a semiconductor substrate a first portion of a polysilicon layer is deposited using a first silane flow rate. An overlying, second portion of the polysilicon layer is next deposited using a second silane flow rate, with the second silane flow rate greater than the first silane flow rate. Photolithographic and dry etching procedures are employed to define a polysilicon gate structure from the polysilicon layer in which a first portion was deposited using a low silane flow, and a second overlying portion was deposited at a higher silane flow.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
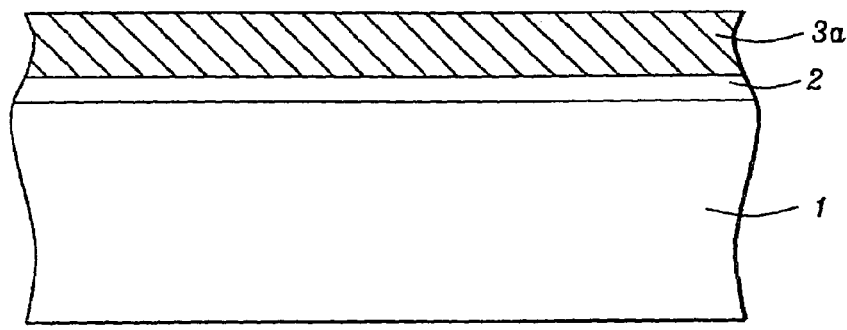
FIGS. 1-4, which schematically, in cross-sectional style describe the formation of a narrow width MOSFET gate structure, defined from a polysilicon layer which in turn is deposited using a low silane flow for an underlying first portion, then employing a higher silane flow for a overlying, second portion of the polysilicon layer.

The method of forming a MOSFET device featuring a narrow width silicon gate structure, wherein the gate structure is defined from a polysilicon layer which in turn is obtained using multiple silane flows designed to optimize performance and to reduce polysilicon bumps, will now be described in detail. Semiconductor substrate 1, comprised of P type single crystalline silicon, featuring a <100> crystallographic orientation, is used and schematically shown in FIG. 1. Gate insulator layer 2, comprised of silicon dioxide, is next thermally grown to a thickness between about 15 to 70 Angstroms. A first, or underlying portion of the polysilicon layer used for the subsequent gate structure, is next deposited. Underlying polysilicon layer 3a, schematically shown in FIG. 1, is deposited at a temperature between about 500 to 600° C., via a low pressure chemical vapor deposition (LPCVD), procedure, to a thickness between about 500 to 1500 Angstroms. A critical deposition parameter is the flow rate of silane gas, used as a source of silicon. A flow rate between about 60 to 100 sccm, considered a low flow rate, results in amorphous or polysilicon layer 3a, comprised with a grain structure allowing improved conductivity when doped, when compared to counterpart polysilicon or amorphous silicon layers deposited using higher silane flows. The improved conductivity of polysilicon or amorphous silicon layer 3a, translating into improved MOSFET performance, however is negated by the size and number of polysilicon or amorphous silicon bumps, incorporated in the low silane polysilicon or amorphous silicon layer 3a. The size of the bumps, between about 0.15 to 0.20 um, can adversely influence the ability to define a narrow gate width of about 0.22 um, from the low silane flow, polysilicon or amorphous silicon layer. Therefore to realize the performance benefit of low silane flow layers, the low flow polysilicon or amorphous silicon layer will be used only as an underlying component of the subsequent gate structure. The use of only an underlying, low silane flow polysilicon or amorphous silicon component, will result in a lower bump density when compared to compared to counterpart gate structures defined entirely in a polysilicon layer obtained using low silane flows. Polysilicon or amorphous silicon layer 3a, is either doped in situ, during deposition via the addition of arsine, or phosphine to the silane flow, or polysilicon or amorphous silicon layer 3a, is deposited intrinsically than doped via implantation of arsenic or phosphorous ions.

Figure 2:
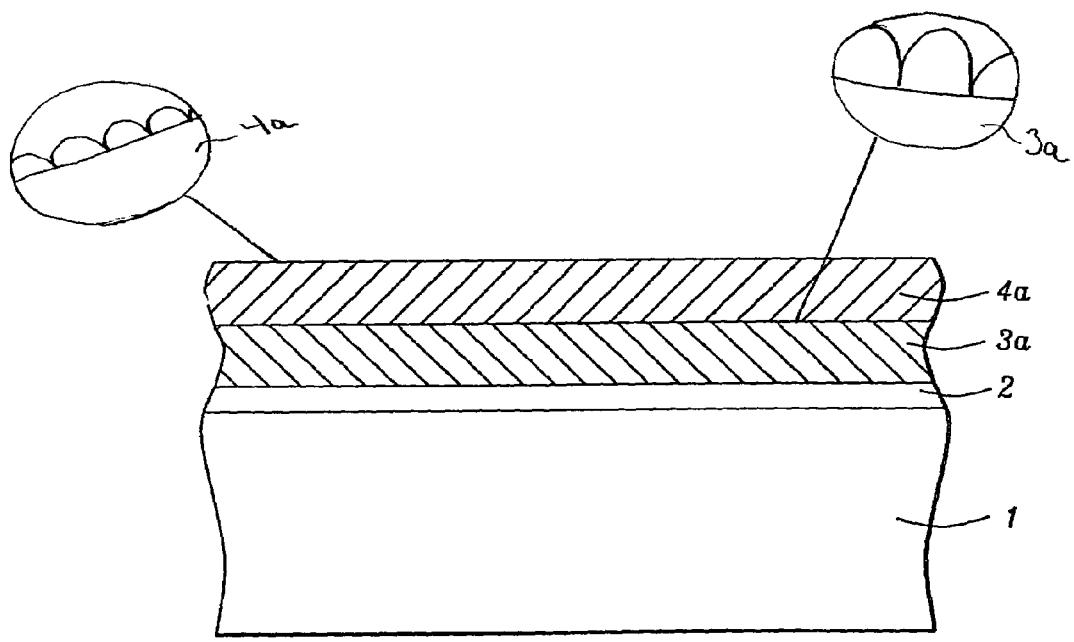

Overlying polysilicon or amorphous silicon layer 4a, is next deposited employing higher silane flows than previously used for underlying polysilicon or amorphous silicon layer 3a. Polysilicon or amorphous silicon layer 4a, shown schematically in FIG. 2, is deposited to a thickness between about 500 to 1500 Angstroms, via LPCVD procedures at a temperature between about 500 to 600.degree. C. The critical silane, or disilane flow rate for polysilicon or amorphous silicon layer 4a, is between about 110 to 160 sccm a flow rate greater than the silane flow rate used for deposition of polysilicon or amorphous silicon layer 3a. The use of the higher silane flow results in polysilicon or amorphous silicon layer 4a, comprised with a bump size between about 0.1 to 0.15 um, a reduced bump size when compared to the bump size of polysilicon or amorphous silicon layer 3a. This is shown by the enlarged window regions of FIG. 2. Polysilicon or amorphous silicon layer 4a, is either doped in situ, during deposition via the addition of arsine, or phosphine to the silane flow, or polysilicon or amorphous silicon layer 3a, is deposited intrinsically than doped via implantation of arsenic or phosphorous ions. Therefore the composite layer comprised of overlying polysilicon or amorphous silicon layer 4a, and underlying polysilicon or amorphous silicon layer 3a, offers a conductive layer which when defined as a gate structure will feature improved performance when compared to counterpart gate structures defined entirely from polysilicon layers deposited using high silane flows, and will feature reduced bump or defect density when compared to counterpart gate structures defined entirely from polysilicon layers deposited using low silane flows.

Figure 3:
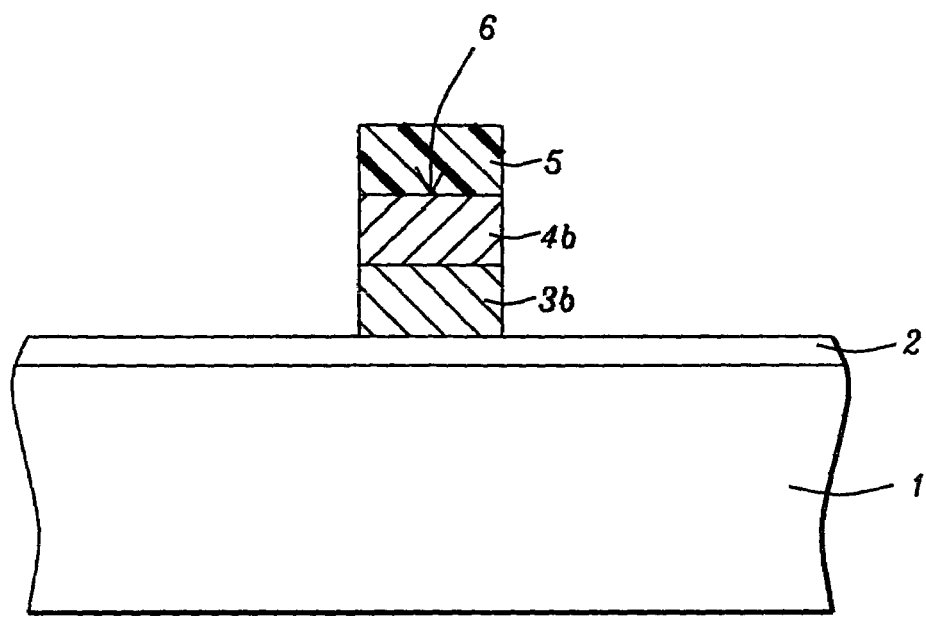

Definition of gate structure 6, is next addressed and schematically shown in FIG. 3. Photoresist shape 5, is used as an etch mask to allow an anisotropic reactive ion etch (RIE), procedure, using $Cl_2$ or $SF_6$ as a selective etchant for polysilicon or amorphous silicon, to define gate structure 6, in overlying polysilicon or amorphous silicon layer 4a, and in underlying polysilicon or amorphous silicon layer 3a. The selective RIE procedure terminates at the appearance of the top surface of gate insulator layer 2. Gate structure 6, comprised of polysilicon or amorphous silicon shape 4b, and of underlying polysilicon or amorphous silicon shape 3b, is defined with a width between about 0.2 to 0.3 um, allowing the sub-0.25 um MOSFET devices to be subsequently realized. The reduced bump or defect density of the gate structure, realized via the use low bump density polysilicon or amorphous silicon shape 4b, allowed the narrower gate structure widths to be realized.

Figure 4:
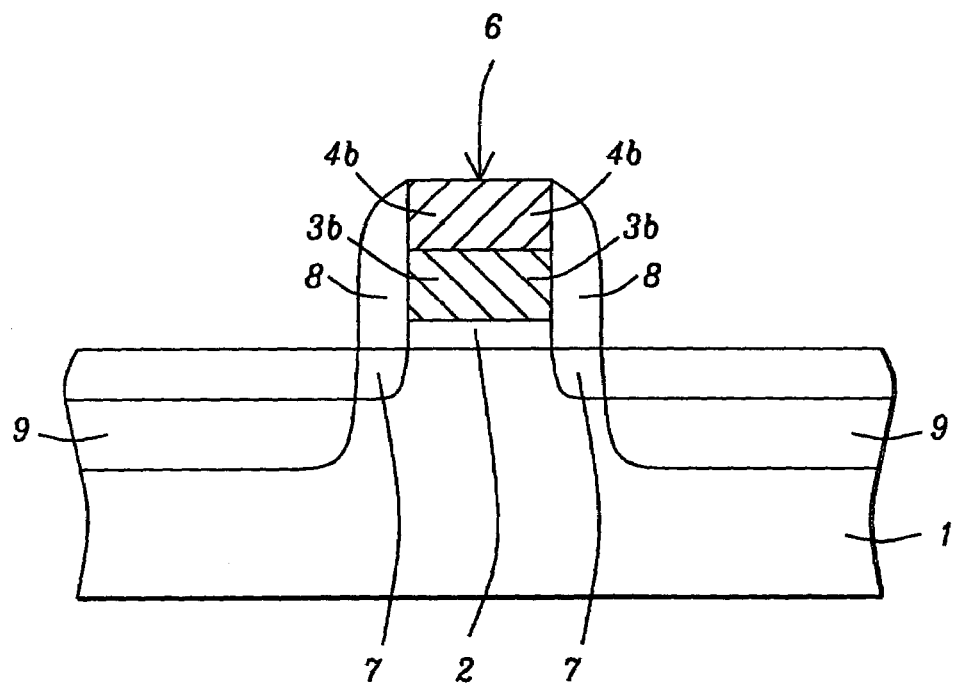

Formation of a MOSFET device, featuring a sub-0.25 um, or 0.22 um channel region, and featuring composite gate structure 6, is next addressed and schematically illustrated using FIG. 4. Removal of photoresist shape 5, is accomplished via plasma oxygen ashing and wet clean procedures, with a buffered hydrofluoric acid cycle used as a component of the wet clean procedure removing the exposed portion of gate insulator layer 2, not covered by composite gate structure 6. Lightly doped source/drain region 7, is next formed in portions of semiconductor substrate 1, not covered by composite gate structure 6, via implantation of arsenic or phosphorous ions. An insulator layer such as silicon oxide, or silicon nitride, is next deposited at a thickness between about 500 to 2000 Angstroms, via LPCVD or via plasma enhanced chemical vapor deposition (PECVD), procedures An anisotropic RIE procedure, using $CHF_3$ or $Cl_2$ as an etchant, is next employed to define insulator spacers 8, on the sides of composite gate structure 6. Heavily doped source/drain region 9, is next formed in portions of semiconductor substrate 1, not covered by composite gate structure 6, or by insulator spacers 8, via implantation of arsenic or phosphorous ions, implanted using a higher dose than used for lightly doped source/drain region 7. Although this invention has been described as a N channel MOSFET device, a P channel MOSFET device can also be fabricated featuring composite gate structure 6, again defined from an overlying polysilicon or amorphous silicon layer deposited using high silane flows, and from an underlying polysilicon or amorphous silicon layer deposited using low silane flows. The P channel MOSFET device would be accomplished via formation of an N well region in a top portion of semiconductor substrate 1, and after gate insulator growth and definition of composite gate structure 6, formation of P type, lightly doped, and P type, heavily doped source/drain regions, located in a top portion of the N well region.

While this invention has been particularly shown and described with reference to the preferred embodiments thereof, it will be understood by those skilled in the art that various changes in form and details may be made without departing from the spirit and scope of this invention.

What is claimed is:

1. A transistor structure comprising:
   a gate insulator layer formed over a semiconductor substrate; and
   a conductive gate structure formed over said gate insulator layer comprising:
      an overlying conductive layer including first bump features extending from a surface of said overlying conductive layer; and an underlying conductive layer underlying said overlying conductive layer and including second bump features extending from a surface of said underlying conductive layer, wherein said second bump features are greater in size than said first bump features of said overlying conductive layer, wherein said overlying conductive layer comprises polysilicon or amorphous silicon, wherein said underlying conductive layer is a doped conductive layer, and wherein said underlying and overlying conductive layers are doped with dopants of the same conductivity type.

2. The transistor structure of claim 1, further comprising a lightly doped source/drain region in said semiconductor substrate, insulator spacers on sides of said conductive gate structure, and a heavily doped source/drain region in said semiconductor substrate.

3. The transistor structure of claim 1, wherein said underlying conductive layer has a thickness between about 500-1500 Å in thickness.

4. The transistor structure of claim 3, wherein said underlying conductive layer comprises polysilicon or amorphous silicon.

5. The transistor structure of claim 1, wherein said second bump features include bump features having bump sizes between about 0.15 to 0.20 µm.

6. The transistor structure of claim 1, wherein said overlying conductive layer is between about 500-1500 Å in thickness.

7. The transistor structure of claim 1, wherein said first bump features include bump features having bump sizes between about 0.10 to 0.15 µm.

8. The transistor structure of claim 1, wherein the width of said conductive gate structure is less than or equal to about 0.25 µm.

9. The transistor structure of claim 1, wherein said overlying conductive layer is formed using a first set of deposition conditions featuring a first source flow rate, and said underlying conductive layer is formed using a second set of deposition conditions featuring a second source flow rate, wherein said second source flow rate is less than said first source flow rate.

10. The transistor structure of claim 9, wherein said first set of deposition conditions features a silane flow rate between about 110-160 sccm and said second set of deposition conditions features a silane flow rate between about 60-100 sccm.

11. An integrated circuit comprising a metal oxide semiconductor field effect transistor (MOSFET) device on a semiconductor substrate, said device comprising:

a gate insulator layer formed over a semiconductor substrate; and a conductive gate structure formed over said gate insulator layer, comprising:

a first silicon layer formed over said gate insulator layer and including first bump features extending from a surface of first silicon layer; and a second silicon layer formed over said first silicon layer and including second bump features extending from a surface of said second silicon layer, wherein said second bump features are less in size than said first bump features, wherein said second silicon layer comprises polysilicon or amorphous silicon, wherein said first silicon layer comprises polysilicon or amorphous silicon, and wherein said first and second silicon layers are doped with dopants of the same conductivity type.

12. The integrated circuit of claim 11, further comprising a lightly doped source/drain region in said semiconductor substrate, insulator spacers on sides of said conductive gate structure, and a heavily doped source/drain region in said semiconductor substrate.

13. The integrated circuit of claim 11, wherein said first bump features include bump features having bump sizes greater than or equal to about 0.15 µm.

14. The integrated circuit of claim 11, wherein each of said first and second silicon layers has a thickness between about 500-1500 Å.

15. The integrated circuit of claim 11, wherein the width of said conductive layer is less than or equal to about 0.25 µm.

16. The integrated circuit of claim 11, wherein said first silicon layer is formed using a first set of deposition conditions featuring a first silane flow rate and said second silicon layer is formed using a second set of deposition conditions featuring a second silane flow rate, said second silane flow rate being greater than said first silane flow rate, wherein the sizes of said first and second bump features are dependent on the silane flow rates used in forming said first and second silicon layers.

17. The integrated circuit of claim 16, wherein said first silane flow rate is between about 60-100 sccm and said second silane flow rate is between about 110-160 sccm.

18. A transistor structure comprising:

a gate insulator layer formed over a semiconductor substrate; and a conductive gate structure formed over said gate insulator layer comprising:

an overlying conductive layer including first bump features extending from a surface of said overlying conductive layer, said overlying conductive layer characterized by a first defect density; and an underlying conductive layer underlying said overlying conductive layer and including second bump features extending from a surface of said underlying conductive layer, said underlying conductive layer characterized by a second defect density, wherein said first defect density is less than the second defect density, wherein said overlying conductive layer comprises polysilicon or amorphous silicon, wherein said underlying and overlying conductive layers are doped with dopants of the same conductivity type.

19. The transistor structure of claim 18, wherein:

said second bump features include bump features having bump sizes between about 0.15 to 0.20 µm, wherein said first bump features include bump features having bump sizes between about 0.10 to 0.15 µm, and wherein the width of said conductive gate structure is less than or equal to about 0.25 µm.

20. A transistor structure comprising:

a gate insulator layer formed over a semiconductor substrate; and a conductive gate structure formed over said gate insulator layer comprising:

an overlying conductive layer including first bump features extending from a surface of said overlying conductive layer; and an underlying conductive layer underlying said overlying conductive layer and including second bump features extending from a surface of said underlying conductive layer, wherein said second bump features are greater in size than said first bump features of said overlying conductive layer, wherein:

said overlying conductive layer comprises polysilicon or amorphous silicon, said second bump features include bump features having bump sizes between about 0.15 to 0.20 μm, wherein said first bump features include bump features having bump sizes between about 0.10 to 0.15 μm, and wherein the width of said conductive gate structure is less than or equal to about 0.25 μm.

* * * * *